(12) United States Patent
Yang et al.

(10) Patent No.: US 8,357,959 B2
(45) Date of Patent: Jan. 22, 2013

(54) IMAGE SENSOR MODULE AND METHOD OF MANUFACTURING THE SAME

(75) Inventors: Seung Taek Yang, Seoul (KR); Jong Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 301 days.

(21) Appl. No.: 12/261,631

(22) Filed: Oct. 30, 2008

(65) Prior Publication Data

US 2010/0059838 A1 Mar. 11, 2010

(30) Foreign Application Priority Data

Sep. 10, 2008 (KR) .................. 10-2008-0089466

(51) Int. Cl.
*H01L 31/062* (2012.01)
(52) U.S. Cl. .................. 257/292; 257/E31.121
(58) Field of Classification Search .................. 257/291, 257/292, 294, E31.121, E31.127, E27.134, 257/E27.135, E27.142
See application file for complete search history.

(56) References Cited

U.S. PATENT DOCUMENTS

| | | | |
|---|---|---|---|
| 7,294,819 B2* | 11/2007 | Nagano | 250/208.1 |
| 7,531,790 B2* | 5/2009 | Lee et al. | 250/226 |
| 2004/0082094 A1* | 4/2004 | Yamamoto | 438/65 |
| 2004/0212380 A1* | 10/2004 | Koyama et al. | 324/754 |
| 2005/0275048 A1 | 12/2005 | Farnworth et al. | |
| 2006/0145213 A1* | 7/2006 | Ha | 257/292 |
| 2007/0117349 A1* | 5/2007 | Komatsu et al. | 438/459 |

FOREIGN PATENT DOCUMENTS

| KR | 1020050043754 A | 5/2005 |
|---|---|---|
| KR | 10-0573072 B1 | 4/2006 |
| KR | 1020060079091 A | 7/2006 |

* cited by examiner

*Primary Examiner* — Ha Tran T Nguyen
*Assistant Examiner* — Vongsavanh Sengdara
(74) *Attorney, Agent, or Firm* — Ladas & Parry LLP

(57) ABSTRACT

An image sensor module includes a transparent substrate having recesses defined in a lower face thereof. A light concentration member includes transparent light concentration parts each of which are disposed in a corresponding one of the recesses. Color filters are disposed over each of the light concentration parts and photo diode units having photo diodes are disposed over each of the color filters. An insulation member covers the photo diode units and input/output terminals disposed over the insulation member are each electrically connected to a corresponding photo diode unit.

15 Claims, 8 Drawing Sheets

FIG.16

IMAGE SENSOR MODULE AND METHOD OF MANUFACTURING THE SAME

CROSS-REFERENCE TO RELATED APPLICATIONS

The present application claims priority to Korean patent application number 10-2008-0089466 filed on Sep. 10, 2008, which is incorporated herein by reference in its entirety.

BACKGROUND OF THE INVENTION

The present invention relates generally to an image sensor module and a method of manufacturing the same, and more particularly to an image sensor module that prevents contamination of components of the image sensor module and a method of manufacturing the same.

An image sensor is a semiconductor device that converts an analog signal such as a light signal into an electrical signal.

A conventional image sensor includes photo diodes that generate photoelectrons corresponding to the amount of light that is incident over a semiconductor substrate, driving units that output electrical signals in response to the photoelectrons outputted from each of the photo diodes, color filters disposed over each of the photo diodes, and micro lens units disposed over each of the color filters.

The conventional image sensor is manufactured by sequentially performing unit processes, for example, forming a photo diode over the semiconductor substrate by a photo-diode forming process, forming a color filter over the photo diode by a color filter forming process, and forming a lens unit over the color filter by a lens unit forming process.

However, when the image sensor is manufactured by performing the unit processes, for example those discussed above, the photo diode, the color filter, and the lens unit are likely to be contaminated by contaminants such as particles, such that the operational properties of the image sensor are decreased.

SUMMARY OF THE INVENTION

Embodiments of the present invention include an image sensor module that prevents photo diodes, color filters and, lens units from being contaminated.

Also, embodiments of the present invention include a method of manufacturing the image sensor module.

In one embodiment of the present invention, an image sensor module comprises a transparent substrate having recesses formed over a lower face of the transparent substrate, a light concentration member having transparent light concentration parts disposed in each of the recesses, color filters disposed over each of the light concentration parts, photo diode units having photo diodes that are disposed over each of the color filters to generate photoelectrons corresponding to amount of light passing through each color filter, an insulation member covering the photo diode units, and input/output terminals disposed over the insulation member to be electrically connected to each of the photo diode units.

The transparent substrate includes one of a transparent glass substrate, a transparent quartz substrate, and a transparent synthetic resin substrate.

A plurality of inside faces of the transparent substrate formed by each of the recesses has a curved face.

Each of the light concentration parts has a convex lens shape.

The light concentration member includes driving parts disposed over the lower face corresponding to a portion between the light concentration parts, and the driving parts is integrally formed with each of the light concentration parts.

Each of the driving parts includes a transparent single crystalline silicon.

Each of the driving units includes a plurality of driving transistors that are formed over the driving parts.

The image sensor module further comprises a semiconductor layer covering the lower face of the transparent substrate corresponding to a portion between the light concentration parts.

The semiconductor layer includes a driving unit having a plurality of driving transistors.

The semiconductor layer includes a single crystalline silicon layer.

The image sensor module further comprises a transparent planarization layer disposed between the color filters and the photo diodes facing the color filters.

The image sensor module further comprises a black matrix pattern having a lattice shape, which is disposed over the planarization layer and disposed between adjacent two color filters in a matrix configuration.

The photo diodes are directly disposed over each of the color filters.

The image sensor module further comprises at least one is lens disposed over a concave portion that is formed over an upper face that opposes to the lower face.

The image sensor module further comprises a holder having an opening that exposes the lens and covers the transparent substrate.

The image sensor module further comprises a contact member electrically connected to each of the input/output terminals.

In another embodiment of the present invention, a method of manufacturing an image sensor module comprises steps of forming a plurality of recesses over a lower face of a transparent substrate, forming a light concentration member having a transparent light concentration parts that are filled in each of the recesses, forming color filters over each of the light concentration parts, forming photo diode units over each of the color filters to have a photo diode for generating a sensing signal corresponding to amount of light passing through each color filter, forming an insulation member for covering the photo diode units and forming input/output terminals that are electrically connected to each of photo diode units over the insulation member.

The steps of forming the recesses comprises the steps of forming a photoresist pattern over the lower face to have a plurality of openings in a matrix configuration and etching the lower face of the transparent substrate using the photoresist pattern as an etching mask to form the recesses having a curved surface.

The steps of forming the light concentration member comprises the steps of depositing a transparent semiconductor material over the lower face to form the transparent semiconductor layer that is filled in the recesses and annealing the transparent semiconductor layer to form a transparent single crystalline silicon layer on the lower face.

The steps of forming photo diode units further comprises the step of further comprises the steps of forming a driving unit having a plurality of driving transistors over the transparent single crystalline silicon layer.

Between the steps of forming the color filter and forming the photo diodes units, the method further comprises the steps of, forming a planarization layer over the color filters.

Between the steps of forming the light concentration member and forming the color filters, the method further comprises the steps of, forming a semiconductor layer formed over the lower face corresponding to a portion between adjacent two light concentration parts and annealing the semiconductor layer to form a single crystalline silicon layer on the lower face.

The steps of forming the photo diode units comprises the steps of forming a driving unit having a plurality of driving transistors over the single crystalline silicon layer.

Before the steps of forming the input/output terminals, the method further comprises the steps of, forming a receiving part is having a concave shape over an upper face that opposes to the lower face of the transparent substrate and mounting a lens to the receiving part.

After the steps of mounting the lens to the receiving part, the method further comprises the steps of disposing a holder having an opening that selectively exposes the lens over the transparent substrate.

DESCRIPTION OF SPECIFIC EMBODIMENTS

An image sensor module in accordance with the present invention includes a transparent substrate, a plurality of recesses that are formed on a lower surface of the transparent substrate, a light concentration member having a transparent light concentration part disposed in each of the recesses, color filters disposed over each of the light concentration parts, photodiode units disposed respectively on the color filters and having a photo diode that outputs a sensing signal corresponding to the amount of light passing through the color filter, an insulation member covering each of the photo diode units, and input/output terminals disposed over the insulation member and electrically connected to each of the photo diode units.

Hereinafter, embodiments of the present invention will be described with reference to the accompanying drawings.

Figure 1:
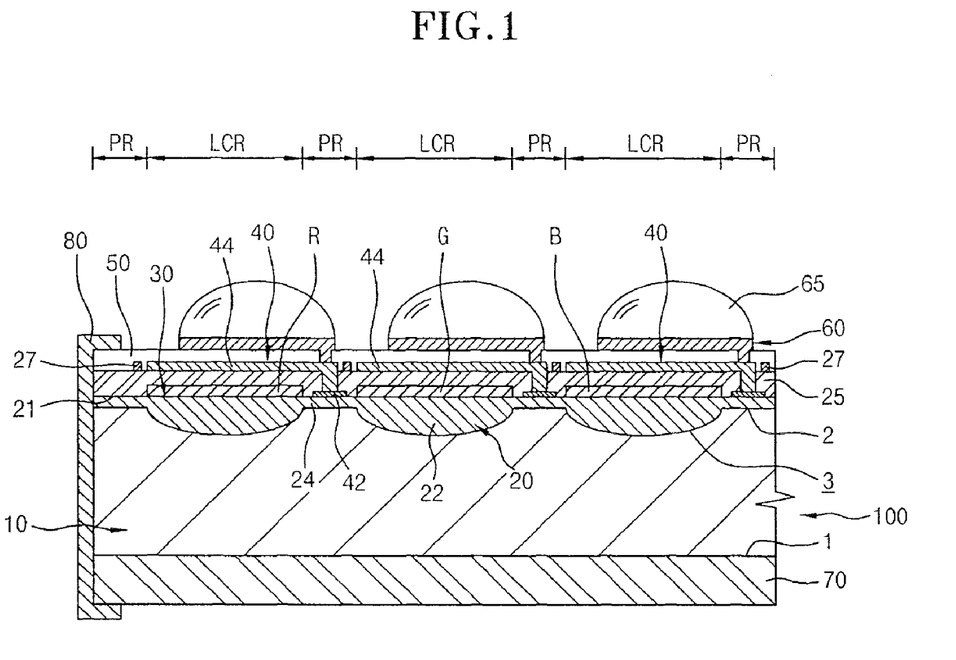
FIG. 1 is a cross-sectional view showing an image sensor module in accordance with an embodiment of the present invention.

FIG. 1 is a cross-sectional view showing an image sensor module in accordance with an embodiment of the present invention.

Referring to FIG. 1, an image sensor module 100 includes a transparent substrate 10, light concentration members 20, color filters 30, photo diode units 40, an insulation member 50, and input/output terminals 60.

According to an embodiment of the present invention, the transparent substrate 10 is formed into a plate shape having an upper face 1 and a lower face 2 that that faces away from the upper face 1. The transparent substrate 10 may be comprised of a material having a high light transmittance index, for example, the transparent substrate 10 may include any one of a transparent glass substrate, a transparent quartz substrate, and a transparent synthetic resin substrate.

The lower face 2 of the transparent substrate 10 includes light concentration regions LCR and peripheral regions PR that are disposed between the light concentration regions LCR. In the present embodiment, the light concentration regions LCR are disposed over the lower face 2 of the transparent substrate 10 in a matrix configuration as will be described below.

When the image sensor module 100 in accordance with the present invention has a resolution of 1,024×768, about 1,024× 768×3 of the light concentration regions LCR are disposed over the lower face 2 of the transparent substrate 10 in a matrix shape.

A plurality of recesses 3 are formed over the lower face 2 of the transparent substrate 10. Each of the recesses 3 is formed so as to correspond to the light concentration regions LCR. Each recess 3 has a substantially square shape when viewed from above (plan view) and each recess 3 has a curved surface when viewed in the cross-sectional view.

The light concentration member 20 is disposed over the lower face 2 of the transparent substrate 10. In the present embodiment, the light concentration member 20 includes light concentration parts 22 and driving parts 24.

The light concentration parts 22 are disposed within each of the recesses 3 arranged on the lower face 2 of the transparent substrate 10 such that the light concentration parts 22 have a shape corresponding to the shape of the recess 3. The light concentration parts 22 have, for example, a convex lens shape.

The driving parts 24 are disposed on the peripheral region PR of the lower face 2 of the transparent substrate 10 and the driving parts 24 are integrally formed with the light concentration parts 22 filled in each of recesses 3. An upper face 21 of the light concentration member 20 having the light concentration parts 22 and the driving parts 24 has a substantially planar (flat) surface.

In the present embodiment, the light concentration parts 22 and the driving parts 24 of the light concentration member 20 may include a material such as a transparent single crystalline silicon.

The color filters 30 are respectively disposed over each of the light concentration parts 24 of the light concentration member 20. In the present embodiment, the color filters 30 include a red color filter R by which only red light is passed from white light, a green color filter G by which only green light is passed from white light, and a blue color filter B by which only blue light is passed from white light. The red, green, and blue color filters R, G, B of the color filters 30 may include a photosensitive material and red, green, and blue dyes or red, green, and blue pigments.

In the present embodiment, the image sensor module 100 further includes a planarization layer 25 on the light concentration member 20. According to the present embodiment, the planarization layer 25 may include an organic layer. The planarization layer 25 is disposed over the light concentration region LCR and the peripheral region PR to cover the color filters 30 disposed on the light concentration member 20.

A plurality of the photodiode units 40 include driving units 42 and photo diodes 44.

Each photo diode 44 is disposed over the planarization layer 25 such that a photodiode 44 corresponds to each of the color filters 30. Each photo diode 44 generates photoelectrons corresponding to the amount of light passing through each of color filters 30.

Although the present embodiment has been described such that the photo diodes 44 of the photo diode unit 40 are formed on the planarization layer 25, according to the present invention, the photo diodes 44 of the photo diode unit 40 may be directly formed on the color filters 30 without the planarization layer 25.

The driving unit 42 of the photo diode unit 40 are formed on the driving part 24 of the light concentration member 20 including the transparent single crystalline silicon. Thus, the driving units 42 and color filters 30 are disposed on substantially the same plane. In the present embodiment, the driving unit 42 may include four to six driving transistors (not shown), which are formed using the transparent single crystalline silicon. Each driving units 42 is electrically connected to each photo diodes 44 corresponding to the driving units 42 so as to generate a sensing signal that corresponds to the photoelectrons generated from each photo diode 44.

The image sensor module 100 in accordance with the present invention further includes a black matrix pattern formed on the planarization layer 25 in the peripheral region PR. The black matrix pattern 27 is disposed between the photo diodes 44 arranged in a matrix configuration. The black matrix pattern 27 has a lattice shape when viewed from above (plan view). The black matrix pattern 27 may comprise a material such as chrome, chromium oxide, black organic material, or the like. The black matrix pattern 27 absorbs light incident on a gap defined by the space between adjacent photo diodes 44 and therefore improves the light sensitivity of the photo diodes 44 without interference by the light being incident on the gap.

The insulation member 50 is disposed over the planarization layer 25. In the present embodiment, the insulation member 50 may be an organic layer and the insulation member 50 electrically insulates the photo diodes 44 from the input/output terminals 60 described below.

The input/output terminals 60 are disposed over the insulation member 50. The input/output terminals 60 are electrically connected to the driving unit 42 of the photo diode unit 40 by a conductive via (not shown) formed at the insulation member 50 so as to output the sensing signal that is generated from the driving unit 42 to a contact member described below.

In the present embodiment, the image sensor module 100 further includes a plurality of contact members 65. Each of the contact members 65 may be electrically contacted to a corresponding input/output terminal 60. The contact member 65 comprises a conductive material, for example, a solder with a low melting point.

According to the present embodiment, the image sensor module 100 further includes at least one lens 70. The lens 70 is disposed over the upper face 1 of the transparent substrate 10. In the present embodiment, the lens 70 may be a convex lens for concentrating light. In order to mount the lens 70 on the upper face 1 of the transparent substrate 10, a lens receiving recess, which has a concave shape, for receiving the lens 70 is defined in the upper face 1 of the transparent substrate 10. In the present embodiment, when the lens 70 is directly mounted on the upper face 1 of the transparent substrate 10, the size, specifically the thickness or volume, of the image sensor module 100 may be substantially reduced.

In the present embodiment, the image sensor module 100 further includes a holder 80 that fixes the lens 70 to the upper face 1 of the transparent substrate 10. The holder 80 blocks the light incident on the outside of the lens 70 and includes an opening that exposes the lens 70 for receiving light.

FIGS. 2 through 8 are cross-sectional views showing the steps of a method of manufacturing an image sensor module in accordance with the present invention in FIG. 1.

Figure 2:
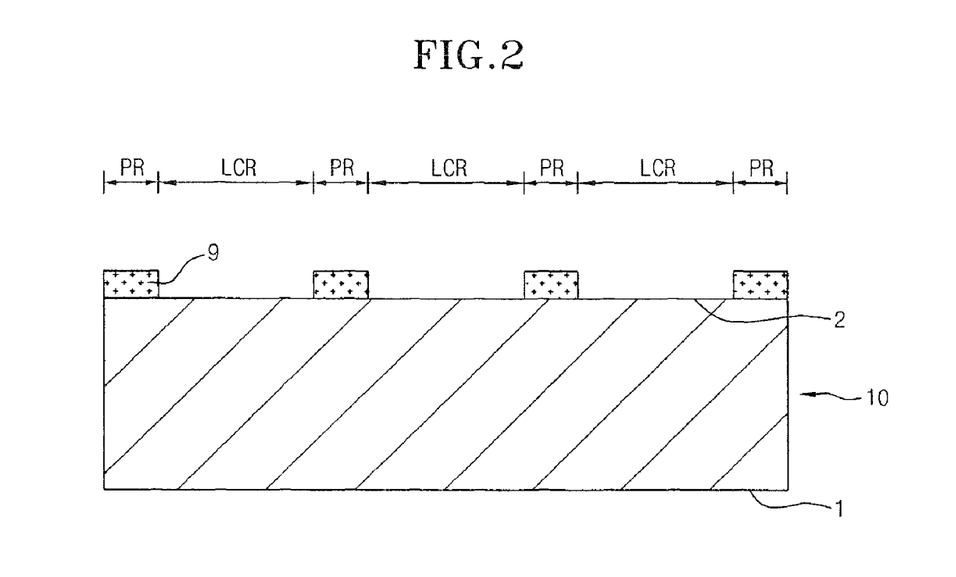
FIGS. 2 through 8 are cross-sectional views showing the steps of a method of manufacturing the image sensor module in FIG. 1.

Referring to FIG. 2, a transparent substrate 10 is prepared in order to manufacture the image sensor module. In the present embodiment, the transparent substrate 10 may be comprised of a material having a high light transmittance index, for example, the transparent substrate 10 may include a transparent glass substrate, a transparent quartz substrate, or a transparent synthetic resin. The transparent substrate 10 has, for example, a plate shape having an upper face 1 and a lower face 2, which faces away from the upper face 1.

The lower face 2 of the transparent substrate 10 has light concentration regions LCR and peripheral regions PR that are formed between the light concentration regions LCR. In the present embodiment, the light concentration regions LCR are formed over the lower face 2 of the transparent substrate 10 in a matrix configuration. When the image sensor module 100 in accordance with the present invention has a resolution of 1,024×768, about 1,024×768×3 of the light concentration regions LCR are formed over the lower face 2 of the transparent substrate 10 in a matrix shape.

In forming the light concentration regions LCR, a photoresist pattern 9 may be formed over the lower face 2 of the transparent substrate 10. To form the photoresist pattern 9, a photoresist film is formed over the lower face 2 of the transparent substrate 10 by a spin coating process.

Then, the photoresist film is patterned by a photo process, which includes an exposure process and a developing process, so as to form the photoresist pattern 9 that covers the peripheral region PR and exposes the light concentration region LCR.

Figure 3:
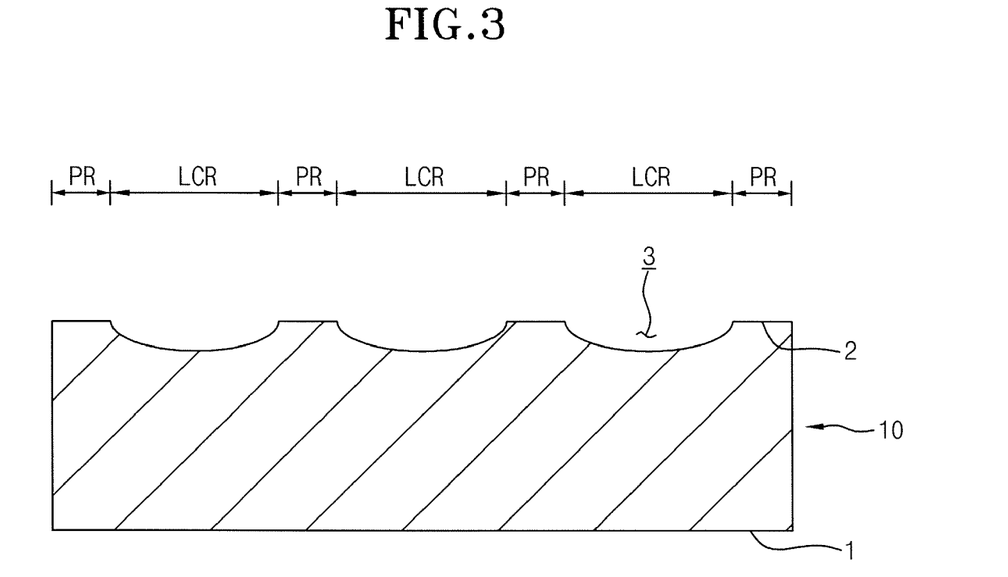

Referring to FIG. 3, after the photoresist pattern 9 is formed over the peripheral region PR of the lower face 2 of the transparent substrate 10, the lower face 2 of the transparent substrate 10 is etched using the photoresist pattern 9 as an etching mask to form a plurality of recesses 3 over each of the light concentration regions LCR of the lower face 2 of the transparent substrate 10.

In the present embodiment, the lower face 2 of the transparent substrate 10, which corresponds to the light concentration region LCR, may be etched by a wet etching process using an etchant or a dry etching process using plasma.

Each of the recesses 3 has a substantially square shape when viewed from above (plan view) and each of the recesses 3 has a curved surface when viewed in the cross-sectional view. Each of the recesses 3 is formed in a light concentration region LCR. When the image sensor module 100 in accordance with the present invention has a resolution of 1,024× 768, about 1,024×768×3 of the recesses 3 are formed over the lower face 2 of the transparent substrate 10 in a matrix shape.

Figure 4:
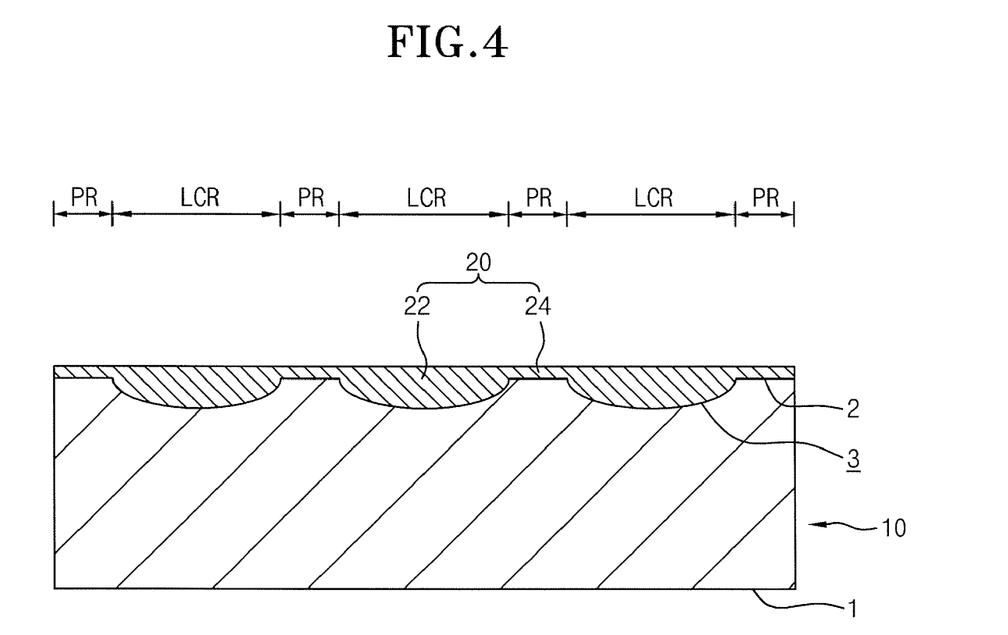

Referring to FIG. 4, after the recesses 3 are formed over the lower face 2 of the transparent substrate 10, a transparent light concentration member 20 is formed over the lower face 2 of the transparent substrate 10 including the recesses 3.

In order to form the light concentration member 20, a transparent amorphous silicon layer or a transparent poly silicon layer is deposited over the lower face 2 of the transparent substrate 10 including the recesses 3. The transparent amorphous silicon layer or the transparent poly silicon layer is subjected to a laser annealing process so as to form the transparent light concentration member 20 having transparent single crystalline silicon over the lower face 2 of the transparent substrate 10.

In the present embodiment, the portions of the transparent light concentration member 20, that correspond to the recesses 3 of the transparent substrate 10 function as light concentration parts 22, and the portions of the transparent light concentration member 20 that correspond to the portion of the lower face 2 that were covered by the photo resist pattern as shown in FIG. 2 function as driving parts 24. That is, the driving parts 24 of the transparent light concentration member 20 are formed between adjacent recesses 3 over the lower surface 2 of the transparent substrate 10. The shape of the concentration parts 22 corresponds to the shape of the recesses 3. For example, according to the present embodiment, the light concentration parts 22 have a convex lens shape.

Figure 5:
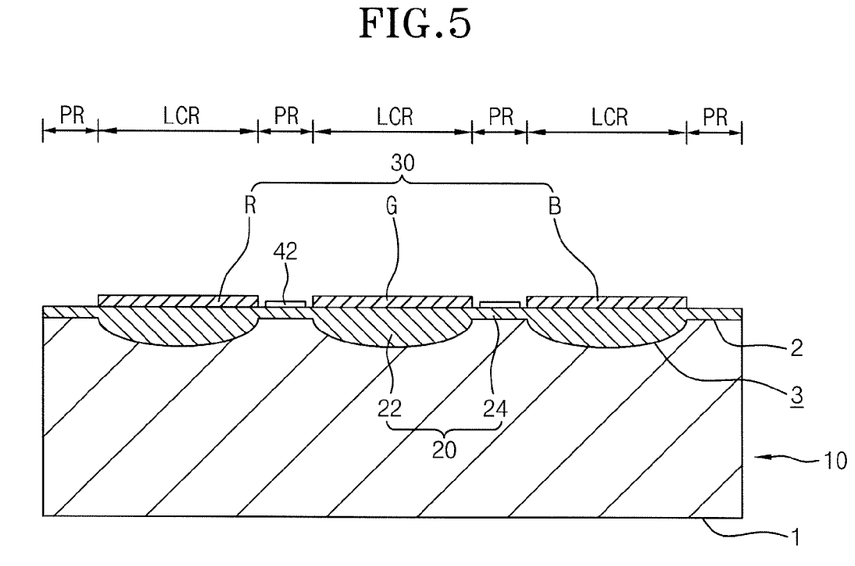

Referring to FIG. 5, after the light concentration member is formed over the lower face 2 of the transparent substrate 10, a plurality of color filters 30 are formed over the light concentration member 20. Each of color filters 30 is formed over a portion of the light concentration member 20 corresponding to a light concentration part 22 of the light concentration member 20, respectively.

The color filters 30 include a red color filter R by which only red light is passed from white light, a green color filter G by which only green light is passed from the white light, and a blue color filter B by which only blue light is passed from the white light.

A plurality of driving units 42 is formed over light concentration member 20 so as to correspond to the driving parts 24. Each of the driving units 42 includes a plurality of driving transistors (not shown), and each transistor is formed on the driving parts 24 having the transparent single crystalline silicon of the driving parts 24. Signal input terminals (not shown) for receiving an input signal and signal output terminals (not shown) for outputting a output signal are formed at the driving units 42 while the driving units 42 are manufactured on the driving parts 24.

In the present embodiment, the driving unit 42 may be formed on the driving parts 24 after forming the color filters 30 on the light concentration part 22 of the light concentration member 20. Alternatively, the driving unit 42 may be formed on the driving parts 24 before forming the color filters 30 on the light concentration parts 22 of the light concentration member 20.

Figure 6:
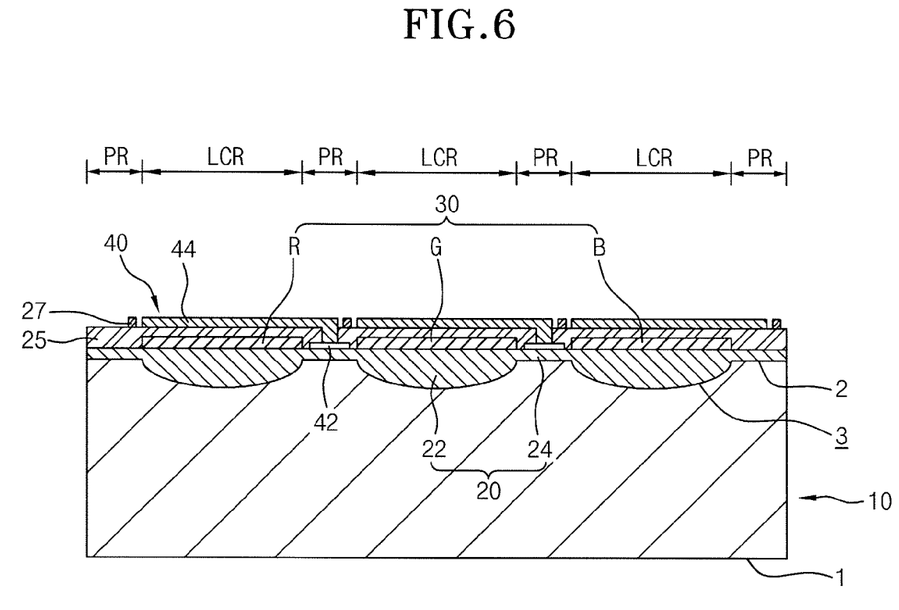

Referring to FIG. 6, after the color filters 30 and the driving unit 42 of the photo diode unit 40 are formed over the light concentration member 20, a planarization layer 25 is formed over the light concentration member 20 to cover both the color filters 30 and the driving units 42. In the present embodiment, the planarization layer 25 may be an organic layer and may include one or more openings that expose the signal input terminal of the driving unit 42.

After the planarization layer 25 is formed over the light concentration member 20, a plurality of photo diodes 44 of the photo diode unit 40 are formed over the planarization layer 25.

In order to form a photo diode 44, a semiconductor layer (not shown) including one of an amorphous silicon layer, a poly silicon layer, and a single crystalline silicon layer is formed over the planarization layer 25. The semiconductor layer is patterned by a photolithography process to form one or more photo diodes 44 at positions corresponding to the color filters 30. The photo diodes 44 are electrically connected to the signal input terminal exposed through the opening of the planarization layer 25.

A black matrix pattern 27 may be formed over the planarization layer 25. The black matrix pattern 27 if formed by forming an opaque layer (not shown), such as a chrome layer, a chromium oxide layer, or a black organic layer, over the planarization layer 25. The black matrix pattern 27 is formed between the photo diodes 44 in a matrix configuration by patterning the opaque layer through a photolithography process. According to the present embodiment, the black matrix pattern 27 may have a lattice shape when viewed from above (plan view). The black matrix pattern 27 absorbs light incident on a gap defined by the space between adjacent photo diodes 44 and therefore improves the light sensitivity of the photo diodes 44 without interference by the light being incident on the gap.

Figure 7:
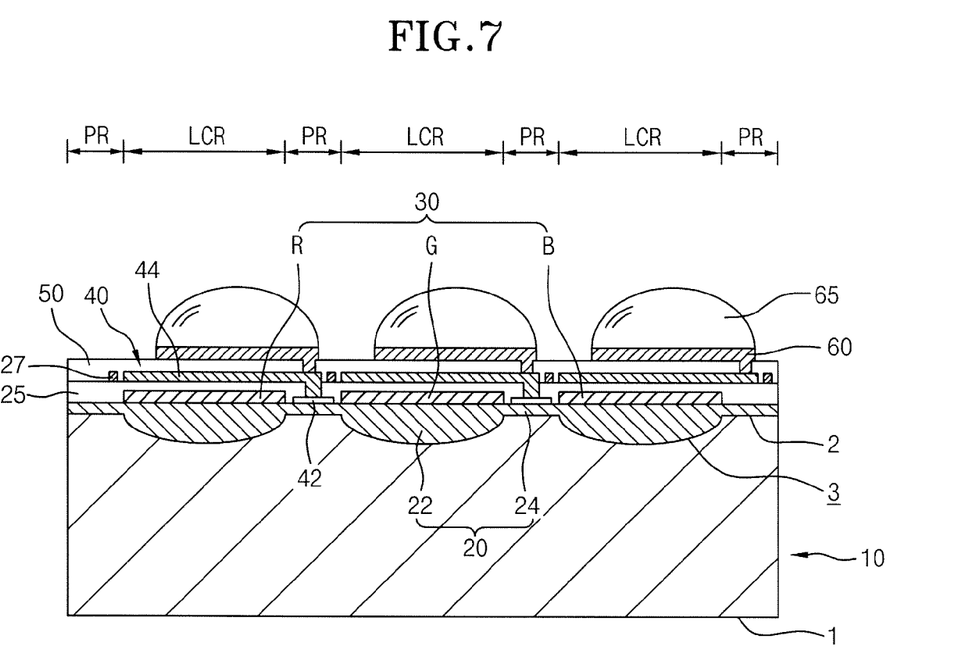

Referring to FIG. 7, an insulation member 50 is formed over the planarization layer 25 after the photo diode 44 and the black matrix pattern 27 are formed over the planarization layer 25. The insulation layer 50 has an opening for exposing the signal output terminal of the driving unit 42. In the present embodiment, the insulation member 50 may be an organic layer.

A plurality of input/output terminals 60 are formed over the insulation layer 50 such that each of the input/output terminals 60 is electrically connected to a signal output terminal of a driving unit 42.

Each of the input/output terminals 60 is connected to a contact member 65. The contact member 65 may be formed of a conductive material, for example, the contact member 65 may be a solder ball that contains a metal such as solder with a low melting point.

Figure 8:
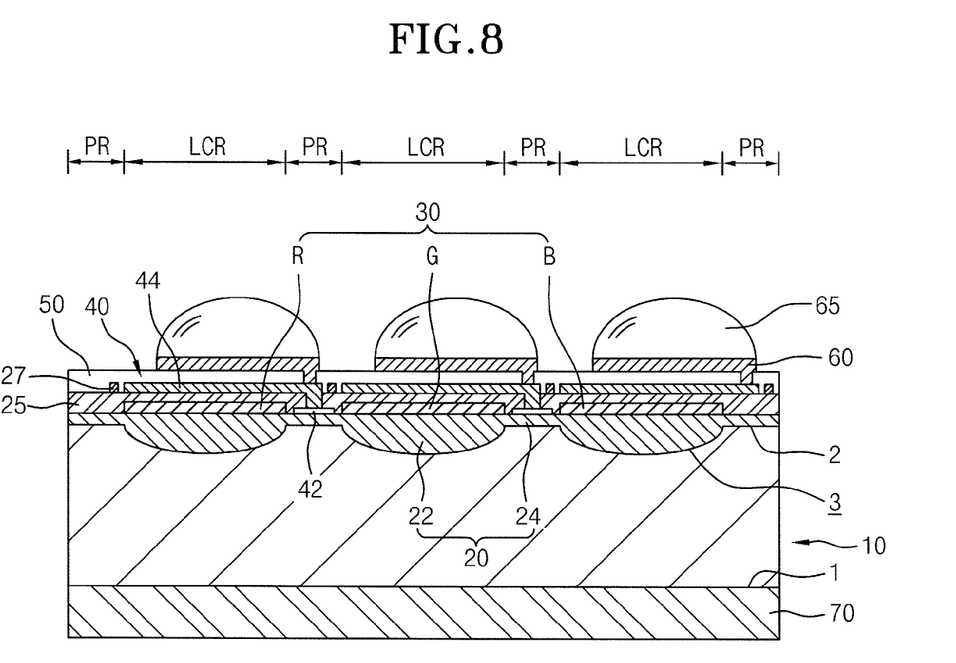

Referring to FIG. 8, a concave lens receiving recess is formed over the upper face 1 of the transparent substrate 10 by an etching process and at least one lens 70 is combined with the upper face 1.

Referring again to FIG. 1, a circuit substrate having an opening may be electrically connected to the contact member 50 and a holder 80 may fix the lens 70 to the upper face 1 of the transparent substrate 10. The holder 80 has an opening that exposes the lens 70 to receive an external light and also blocks light incident on the outside of the lens 70.

Figure 9:
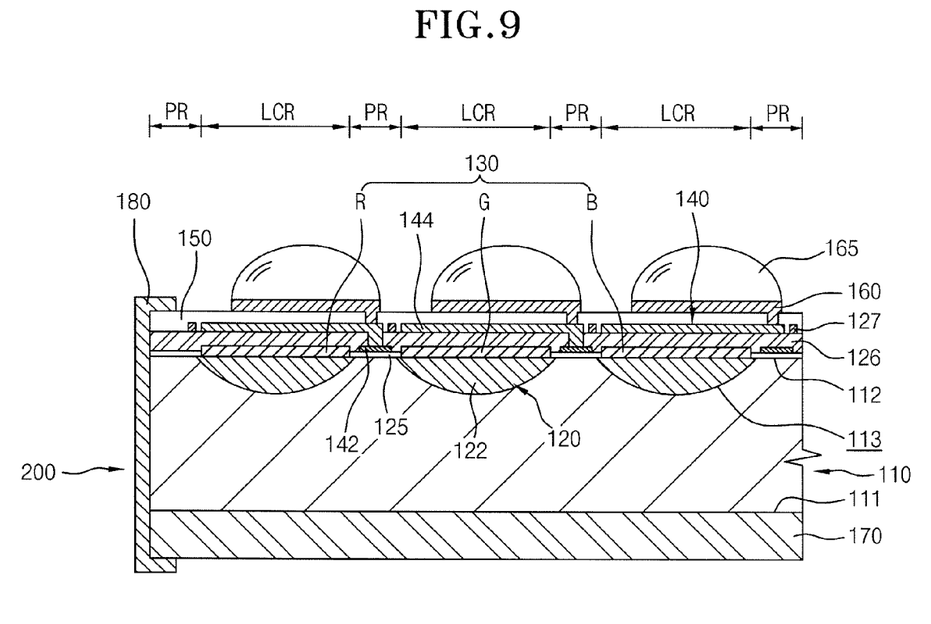
FIG. 9 is a cross-sectional view showing an image sensor module in accordance with another embodiment of the present invention.

FIG. 9 is a cross-sectional view showing an image sensor module in accordance with another embodiment of the present invention.

Referring to FIG. 9, an image sensor module 200 includes a transparent substrate 110, concentration members 120, a semiconductor layer 125, color filters 130, photo diode units 140, an insulation member 150, and input/output terminals 160.

The transparent substrate 110 has, for example, a plate shape having an upper face 111 and a lower face 112 which faces away from the upper face 111. The transparent substrate 110 may be formed of a material having a high light transmittance index, for example the transparent substrate 110 may include any one of a transparent glass substrate, a transparent quartz substrate, and a transparent synthetic resin.

The lower face 112 of the transparent substrate 110 includes light concentration regions LCR and peripheral regions PR that are disposed between the light concentration regions LCR. In the present embodiment, the light concentration regions LCR are disposed over the lower face 112 of the transparent substrate 110 in a matrix configuration. When the image sensor module 200 in accordance with the present invention has a resolution of 1,024×768, about 1,024×768×3 of the light concentration regions LCR are disposed over the lower face 112 of the transparent substrate 110 in a matrix shape.

A plurality of recesses 113 are disposed over the lower face 112 of the transparent substrate 110 so as to correspond to each of the light concentration regions LCR. Each recess 113 has a substantially square shape when viewed above (plan view) and no each recess 113 has a curved surface when viewed in a cross-sectional view.

The light concentration member 120 is disposed over the lower face 112 of the transparent substrate 110. In the present embodiment, the light concentration member 120 includes light concentration parts 122.

The light concentration parts 122 are disposed within each of the recesses 113 arranged on the lower face 112 of the transparent substrate 110 such that the light concentration parts 122 have a shape corresponding to the shape of the recess 113. The light concentration parts 122 have, for example, a convex lens shape. Each of the light concentration parts 122 has a planarization portion and a curved surface portion, and the curved surface portion faces the recess 113.

In the present embodiment, the light concentration part 122 of the light concentration member 120 may include various transparent materials.

The semiconductor layer 125 may be disposed over portions of the lower face 112 of the transparent substrate 110 where the light concentration parts 122 of the light concentration member 120 are not formed. The semiconductor layer 125 may include a material such as a single crystalline silicon layer, or alternatively, the semiconductor layer 125 may include an amorphous silicon layer, a poly silicon layer, or the like. In the present embodiment, the semiconductor layer 125 includes a transparent single crystalline silicon layer.

The color filters 130 are disposed over each of the light concentration parts 124 of the light concentration member 120. In the present embodiment, the color filters 130 include a red color filter R by which only red light is passed from white light, a green color filter G by which only green light is passed from the white light, and a blue color filter B by which only blue light is passed from the white light. The red, green, and blue color filters R, G, B of the color filters 30 may include a photosensitive material and red, green, and blue dyes or red, green, and blue pigments respectively.

In the present embodiment, the image sensor module 200 further includes a planarization layer 126, which may include an organic layer. The planarization layer 126 is disposed over the color filters 130 disposed on the light concentration member 120.

A plurality of the photodiode units 140 include a driving units 142 and a photo diodes 144.

Each of the photo diodes 144 is disposed over the planarization layer 125 corresponding to a color filter 130. Each of the photo diodes 144 generates photoelectrons in response to the amount of light passing through the color filters 130.

In the present embodiment, although the photo diodes 144 of the photo diode unit 140 are shown disposed over the planarization layer 126, the photo diodes 144 of the photo diode unit 140 may alternatively be disposed directly on the color filters 130 without the planarization layer 25.

The driving unit 142 of a photo diode unit 140 is disposed over the semiconductor layer 126. The driving unit 142 may include four to six driving transistors (not shown) which are formed by using the single crystalline silicon. Each of the driving units 142 is electrically connected to a corresponding one of the photo diodes 144. Each driving unit 142 generates a sensing signal in response to the photoelectrons output from the corresponding one of the photo diodes 144.

A black matrix pattern 127 may be disposed over the planarization layer 126 between the photo diodes 144 and arranged in a matrix configuration. According to the present embodiment, the black matrix pattern 127 has a lattice shape when viewed from above (plan view). The black matrix pattern 127 may be formed of an opaque material such as chrome, chromium oxide, black organic material, or the like. The black matrix pattern 127 absorbs light incident on a gap defined by the space between adjacent photo diodes 144 and therefore improves the light sensitivity of the photo diodes 144 without interference by the light being incident on the gap.

The insulation member 150 is disposed over the planarization layer 125. In the present embodiment, the insulation member 150 may be an organic layer that electrically insulates the photo diodes 144 from the input/output terminals 160 described below.

The input/output terminals 160 are disposed over the insulation member 150. An input/output terminals 160 is electrically connected with a driving unit 142 of the photo diode unit 140 using a conductive via (not shown) formed at the insulation member 150 so as to output the sensing signal generated from the driving unit 142.

In the present embodiment, the image sensor module 200 further includes a plurality of contact members 165. Each contact member 165 may be electrically contacted to a corresponding input/output terminal 160. The contact member 165 includes a conductive material, for example, a metal such as solder with a low melting point.

Meanwhile, the image sensor module 200 in accordance with the present embodiment further includes at least one lens 170. The lens 170 is disposed over the upper face 111 of the transparent substrate 110. In the present embodiment, the lens 170 may be a convex lens for concentrating external light. In order to mount the lens 170 to the upper face 111 of the transparent substrate 110, a lens receiving recess, which has a concave shape, suitable for receiving the lens 170 is formed on the upper face 111 of the transparent substrate 110. When the lens 170 is directly mounted on the upper face 111 of the transparent substrate 110 as described above, the size of the image sensor module 200, specifically the thickness or a volume of the image sensor module 200, may be substantially reduced.

The image sensor module 200 in accordance with the present invention further includes a holder 180. The holder 180 is fixes the lens 170 to the upper face 111 of the transparent substrate 110, and blocks light incident to the outside of the lens 170, and additionally, the holder 180 includes an opening which exposes the lens 170 for receiving light.

FIGS. 10 through 16 are cross-sectional views showing the steps of a method of manufacturing an image sensor module in accordance with the present invention in FIG. 9.

Figure 10:
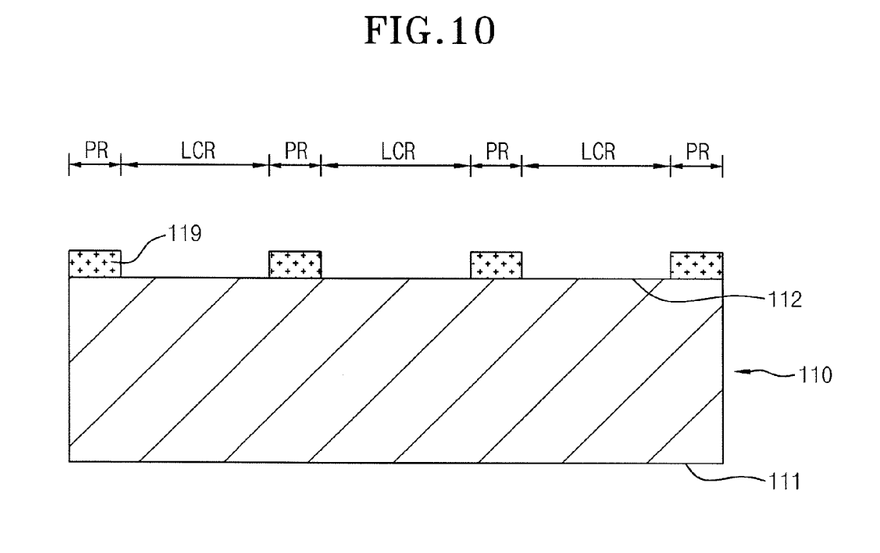
FIGS. 10 through 16 are cross-sectional views showing the steps of a method of manufacturing the image sensor module in FIG. 9.

Referring to FIG. 10, a transparent substrate 110 is prepared to manufacture the image sensor module. In the present embodiment, the transparent substrate 110 may comprise a material having a high light transmittance index, for example, the transparent substrate 110 may include a transparent glass substrate, a transparent quartz substrate, or a transparent synthetic resin. The transparent substrate 110 has, for example, a plate shape having an upper face 111 and the lower face 112 which faces away from the upper face 111.

The lower face 112 of the transparent substrate 110 has light concentration regions LCR and peripheral regions PR that are formed between the light concentration regions LCR. In the present embodiment, the light concentration regions LCR are formed over the lower face 112 of the transparent substrate 110 in a matrix configuration. When the image sensor module 200 in accordance with the present invention has a resolution of 1,024×768, about 1,024×768×3 of the light concentration regions LCR are formed over the lower face 112 of the transparent substrate 110 in a matrix shape.

In forming the light concentration regions LCR, a photoresist pattern 119 may be formed over the lower face 112 of the transparent substrate 110. To form the photoresist pattern 119, a photoresist film (not shown) is formed over the lower face 112 of the transparent substrate 110 by a spin coating process. The photoresist film is patterned by a photo process which includes an exposure process and a developing process so as to form the photoresist pattern 119 that covers the peripheral region PR and exposes the light concentration region LCR.

Figure 11:
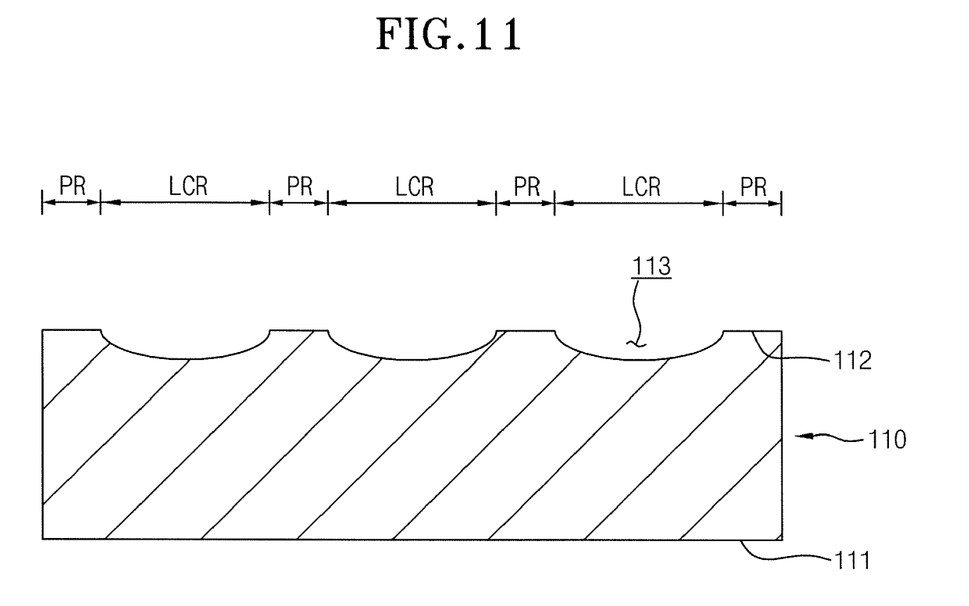

Referring to FIG. 11, after the photoresist pattern 119 is formed over the peripheral region PR of the lower face 112 of the transparent substrate 110, the lower face 112 of the transparent substrate 110 is etched using the photoresist pattern 119 as an etching mask to form a plurality of recesses 113 which correspond to the light concentration regions LCR. In the present embodiment, portions of the lower face 112 of the transparent substrate 110, which correspond to the light concentration region LCR, are etched by a wet etching process using an etchant or a dry etching process using plasma. Each of the recesses 113 has a substantially square shape when viewed from above (plan view) and each of the recesses 113 has a curved surface when viewed in the cross-sectional view. Each of the recesses 113 is formed in a light concentration region LCR. When the image sensor module 100 in accordance with the present invention has a resolution of 1,024× 768, about 1,024×768×3 of the recesses 113 are formed over the lower face 112 of the transparent substrate 110 in a matrix shape.

Figure 12:
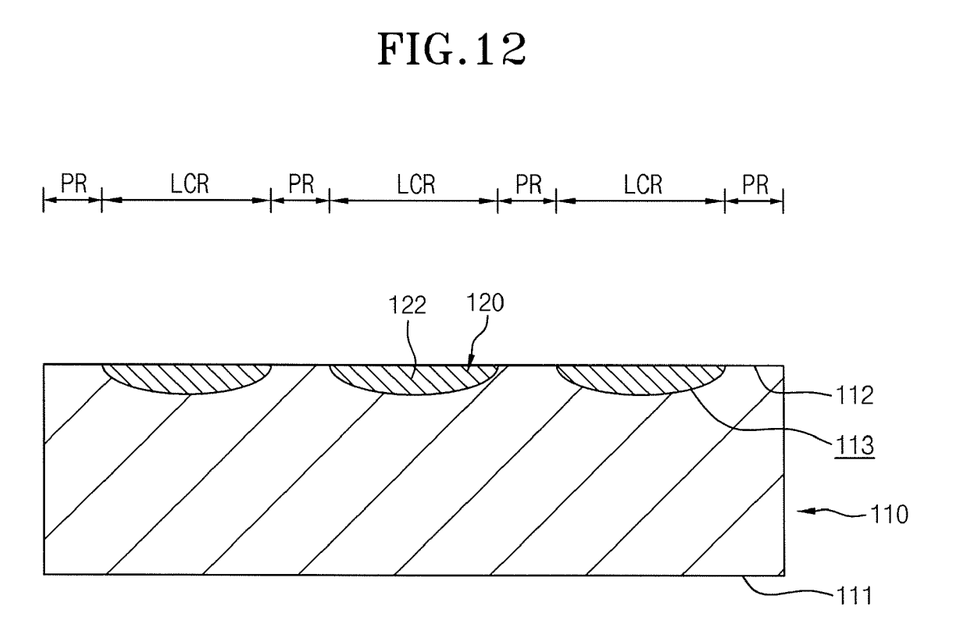

Referring to FIG. 12, after the recesses 113 are formed over the lower face 112 of the transparent substrate 110, a light concentration member 120 having a transparent light concentration part 122 is formed over the lower face 112 of the transparent substrate 10 including the recesses.

In order to form the light concentration member 20 over the lower face 112, a transparent material is formed over the lower face 112 of the transparent substrate 110 such that each of the recesses 113 on the lower face 112 of the transparent substrate 110 are filled with a transparent film. According to the present invention, the transparent film may include a transparent synthetic resin or a transparent organic material. The transparent substrate 110 may have a first light transmittance index and the transparent film may have a second light transmittance index which may or may not be equal to the first light transmittance.

The transparent film that is filled within each of the recesses 113 is etched by an etch back process or a polishing process until the lower face 112 of the transparent substrate 112 is exposed. As a result, the portions of the transparent film which remain in the recesses 113 constitute light concentration parts 122 formed in each of the recesses 113 formed at the lower face 112 of the transparent substrate 110. The light concentration parts 122 may have a convex lens shape.

Figure 13:
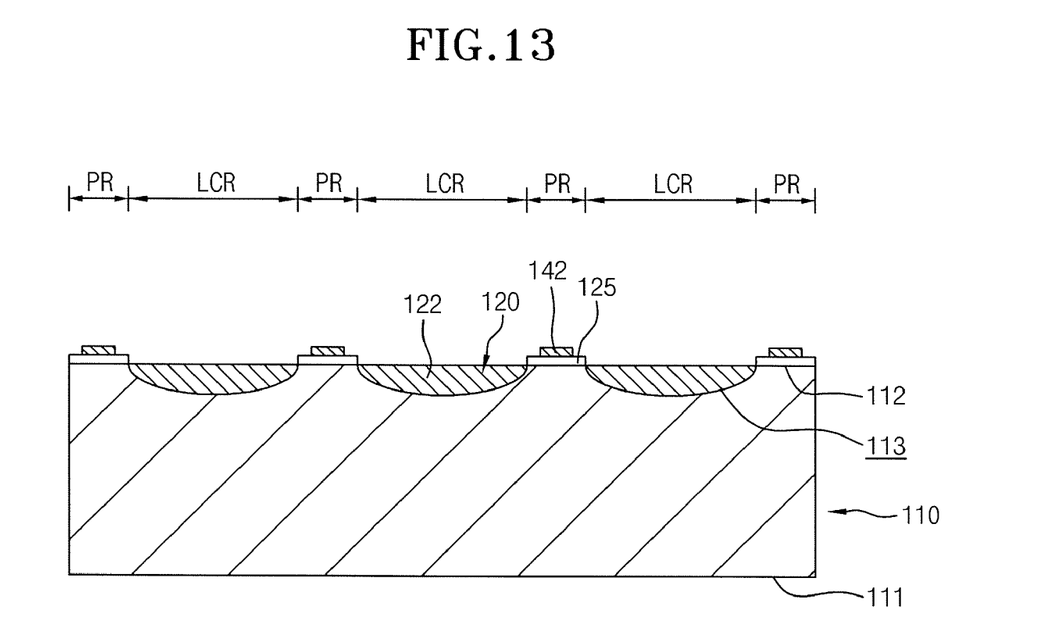

Referring to FIG. 13, after the light concentration part 122 is formed in each of the recesses 113, a semiconductor layer 125 is selectively formed over portions of the transparent substrate 110 corresponding to the peripheral regions PR. That is, the semiconductor layer 125 is selectively formed over potions of the peripheral regions PR between the light concentration parts 122 of the light concentration member 120.

To form the semiconductor layer 125 selectively over portions of the lower face 112, an amorphous silicon layer or a poly silicon layer is deposited over the entire area of the lower face 112 of the transparent substrate 110. The amorphous silicon layer or the poly silicon layer is subsequently patterned by a photolithography process so as to form the semiconductor layer 125 over the peripheral region PR on the lower face 112. Additionally, according to the present embodiment the amorphous silicon layer or the poly silicon layer is crystallized by an annealing process using laser beam, thereby forming a single crystalline layer on the peripheral region PR.

After the semiconductor layer 125 is formed on the peripheral region PR, a plurality of driving units 142 of the photo diode units 140 described below are formed on the semiconductor layer 125. Each of the driving units 142 may include a plurality of driving transistors. Each of the driving units 142 is formed beside or between one or more light concentration parts 122. Each of the driving units 142 includes at least one signal input terminal and at least one signal output terminal (not shown).

Figure 14:
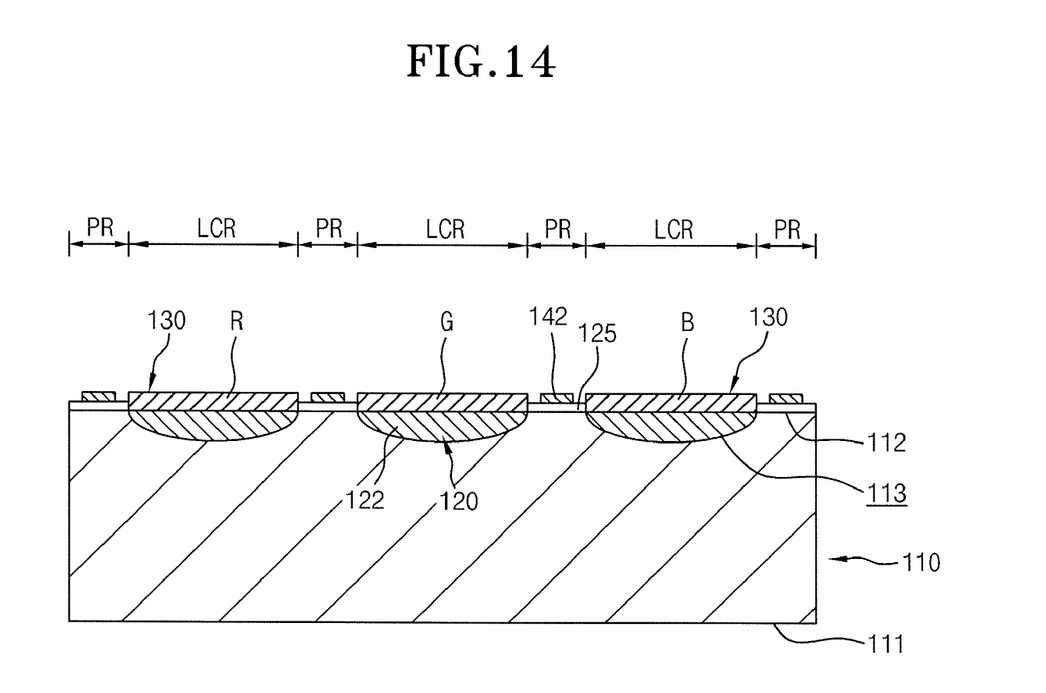

Referring to FIG. 14, after the driving units 142 and the light concentration member 120 having the light concentration parts 122 are formed over the lower face 112 of the transparent substrate 110, a plurality of color filters 130 are formed over the light concentration member 120. Each color filters 130 is formed over a portion corresponding to a corresponding one of the light concentration parts 122 of the light concentration member 120.

The color filters 130 include a red color filter R by which only red light is passed from white light, a green color filter G by which only green light is passed from the white light, and a blue color filter B by which only blue light is passed from the white light.

In the present embodiment the color filter 130 is formed on the light concentration part 122 after forming the driving units 142 over the semiconductor layer 125. Alternatively, the driving unit 142 may be formed over the semiconductor layer 125 before forming the color filters 130 on the light concentration parts 122 of the light concentration member 120.

Figure 15:
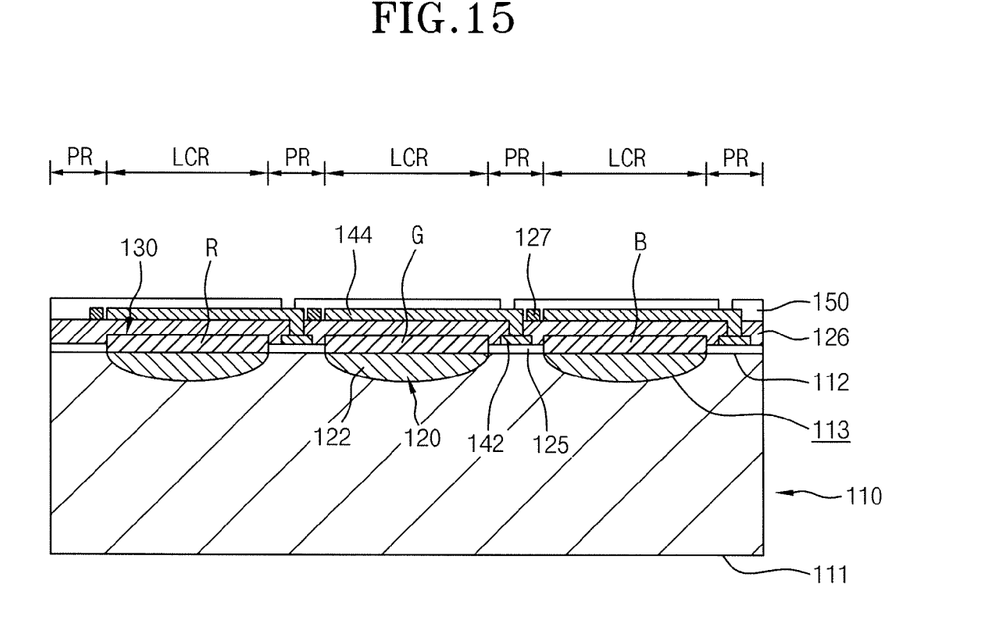

Referring to FIG. 15, after the color filters 130 and the driving unit 142 of the photo diode unit 140 are formed over the light concentration member 120, a planarization layer 126 is formed over the light concentration member 120 to cover both the color filters 130 and the driving units 142. In the present embodiment, the planarization layer 126 may be an organic layer and may include one or more openings that expose the signal input terminal of the driving unit 142.

After the planarization layer 126 is formed over the light concentration member 120, a plurality of photo diodes 144 of the photo diode unit 140 are formed over the planarization layer 125.

To form the photo diode 144, a semiconductor layer (not shown) such as an amorphous silicon layer, a poly silicon layer, or a single crystalline silicon layer is formed over the planarization layer 126. The semiconductor layer is subsequently patterned by a photolithography process to form photo diodes 144 at positions corresponding to the color filters 130. The photo diodes 144 are electrically connected to corresponding signal input terminals exposed through the one or more openings of the planarization layer 126.

A black matrix pattern 127 may be formed over the planarization layer 126. The black matrix pattern 127 is formed by forming an opaque layer (not shown), such as a chrome layer, a chromium oxide layer, or a black organic layer, on the planarization layer 125. The black matrix pattern 27 is formed between the photo diodes 144 in a matrix configuration by patterning the opaque layer through a photolithography process. According to the present invention, the black matrix pattern 127 may have a lattice shape when viewed above (plan view). The black matrix pattern 127 absorbs light incident on a gap defined by the space between adjacent photo diodes 144 to improve the light sensitivity of the photo diodes 144 without interference by the light being incident on the gap.

After the photo diode 144 and the black matrix pattern 127 are formed over the planarization layer 126, an insulation member 150 is formed over the planarization layer 126. The insulation layer 150 may include one or more openings for exposing the signal output terminal of the driving unit 142. In the present embodiment, the insulation member 150 may be organic layer.

Figure 16:
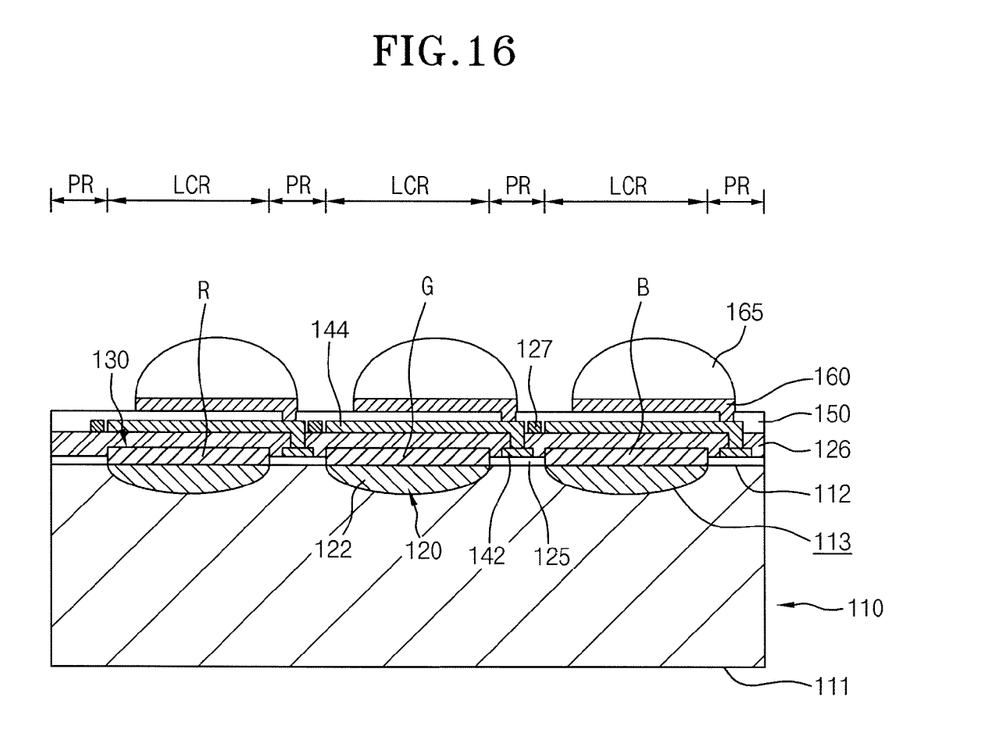

Referring to FIG. 16, a plurality of input/output terminals 160 are formed over the insulation layer 150. Each of the input/output terminals 160 is electrically connected to a predetermined one of the signal output terminals of the driving unit 142.

Each of the input/output terminals 160 is connected to a contact member 165. The contact member 165 may be formed of a conductive material, for example, the contact member may include a solder ball that contains a metal such as solder with a low melting point.

Referring to FIG. 9, a lens receiving recess (not shown) having a concave shape is formed over the upper face 111 of the transparent substrate 110 by an etching process and at least one lens 170 is combined or attached with the lens receiving recess. In the present embodiment, when the lens 170 is directly mounted on the upper face 111 of the transparent substrate 110 as described above, the size of the image sensor module 200, specifically the thickness or volume of the image sensor module 200, may be substantially reduced.

Additionally, a circuit substrate having an opening may be electrically connected to the contact member 150 and a holder 180 may fix the lens 170 to the upper face 111 of the transparent substrate 110. The holder 180 blocks light incident on the outside of the lens 170 and also has an opening that exposes the lens 170 for receiving light.

As is apparent from the above description, in the present invention, a plurality of recesses are formed over the transparent substrate and the light concentration part is formed within the recesses. The color filter is formed over the light concentration part and the photo diode is formed over the color filter. Thus, contamination of the elements of the image sensor module is prevented and the size of the image sensor module is reduced.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. An image sensor module, comprising:
   a transparent substrate having recesses defined in a lower face of the transparent substrate;
   a light concentration member including transparent light concentration parts and connection parts disposed on a portion of the lower face between the transparent light concentration parts, each of the transparent light concentration parts disposed in a corresponding one of the recesses;
   color filters disposed on each of the transparent light concentration parts;
   photo diode units comprising:
      photo diodes that are disposed on each of the color filters; and
      driving units disposed between the color filters and connected with each of the photo diodes;
   an insulation member covering the photo diode units;
   input/output terminals disposed on the insulation member and electrically connected to a corresponding one of the photo diode units; and
   contact members electrically connected on each of the input/output terminals.

2. The image sensor module according to claim 1, wherein the transparent substrate comprises any one of a transparent glass substrate, a transparent quartz substrate, and a transparent synthetic resin substrate.

3. The image sensor module according to claim 1, wherein a portion of the lower face of the transparent substrate defined by a recess has a curved face.

4. The image sensor module according to claim 1, wherein each of the light concentration parts has a convex lens shape.

5. The image sensor module according to claim 1, wherein the connection parts are integral with the transparent light concentration parts.

6. The image sensor module according to claim 5, wherein the connection parts comprise a transparent single crystalline silicon.

7. The image sensor module according to claim 6, wherein the driving units are formed on respective connection parts.

8. The image sensor module according to claim 1, further comprising:
   a semiconductor layer formed on portions the lower face of the transparent substrate between the transparent light concentration parts.

9. The image sensor module according to claim 8, wherein the semiconductor layer comprises a single crystalline silicon layer.

10. The image sensor module according to claim 1, further comprising:
   a transparent planarization layer disposed between the color filters and the photo diodes facing the color filters.

11. The image sensor module according to claim 10, further comprising:
   a black matrix pattern disposed on the transparent planarization layer and between adjacent color filters in a matrix configuration.

12. The image sensor module according to claim 1, wherein each of the photo diodes are directly disposed over the color filters.

13. The image sensor module according to claim 1, further comprising:
   one or more lenses disposed on an upper face that faces away from the lower face.

14. The image sensor module according to claim 13, wherein at least a portion of the lower face is concave in shape and the one or more lenses are disposed within the concave portion of the lower face.

15. The image sensor module according to claim 13, further comprising:
   a holder fixing the one or more lenses to the upper face and covering a portion of the transparent substrate, wherein the holder includes an opening that exposes the one or more lenses.

* * * * *